United States Patent
Bae et al.

(10) Patent No.: US 7,592,869 B2
(45) Date of Patent: Sep. 22, 2009

(54) VARIABLE GAIN AMPLIFIER HAVING DUAL GAIN CONTROL

(75) Inventors: Hyeon Min Bae, Champaign, IL (US); Naresh Ramnath Shanbhag, Champaign, IL (US); Jonathan B. Ashbrook, Homer, IL (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/856,681

(22) Filed: Sep. 17, 2007

(65) Prior Publication Data

US 2009/0072904 A1 Mar. 19, 2009

(51) Int. Cl.
 *H03F 3/45* (2006.01)
(52) U.S. Cl. .................. 330/254; 330/283; 330/300
(58) Field of Classification Search ............ 330/254, 330/283, 300

See application file for complete search history.

(56) References Cited

U.S. PATENT DOCUMENTS

| 5,384,501 | A  | * | 1/1995 | Koyama et al. ............ 330/253 |
| 7,084,704 | B2 | * | 8/2006 | Sowlati ........................ 330/253 |

* cited by examiner

*Primary Examiner*—Khanh V Nguyen
(74) *Attorney, Agent, or Firm*—Workman Nydegger

(57) ABSTRACT

An electronic amplifier circuit that provides improved gain control linearity characteristics resulting from having a controllable field effect transistor (FET) acting as a degeneration resistance (degeneration resistance FET) and a controllable load resistance FET. The overall gain function of the amplifier exhibits improved linearity in part due to the presence of the load FET, which tends to cancel the nonlinear behavior emanating from the degeneration FET. The circuit also includes a control circuit for generating non-linear control signals that are responsive to process characteristics of the FETs, such that the degeneration resistance FET and load resistance FETs may be controlled more consistently and independently from process variations.

16 Claims, 4 Drawing Sheets

VARIABLE GAIN AMPLIFIER HAVING DUAL GAIN CONTROL

BACKGROUND OF THE INVENTION

A. Field of the Invention

The invention described herein relates to methods and devices for providing a variable gain amplifier having improved gain linearity.

B. Description of the Related Art

Variable gain amplifiers (VGA) are used in numerous circuits to provide a desired amount of gain under varying conditions. One common use of VGAs is in automatic gain control (AGC) circuits to adjust the level of an incoming signal to the appropriate level for further processing. For example, the VGA may adjust the signal level to ensure the signal lies within the optimal dynamic range of an analog to digital converter. The VGA may be required to have a wide dynamic range, and may need to rapidly adjust to changing signal conditions.

SUMMARY OF THE INVENTION

Described herein is an electronic amplifier circuit that provides improved gain control linearity characteristics resulting from having a controllable field effect transistor (FET) acting as a degeneration resistance (degeneration resistance FET) and a controllable load resistance FET. The overall gain function of the amplifier exhibits improved linearity in part due to the presence of the load FET, which tends to cancel the nonlinear behavior emanating from the degeneration FET. The circuit also includes a control circuit for generating nonlinear control signals that are responsive to process characteristics of the FETs, such that the degeneration resistance FET and load resistance FETs may be controlled more consistently and independently from process variations.

In one preferred method of controlling the gain of a differential pair transistor amplifier, a variable degeneration resistance together with a variable load resistance may be used to increase the tuning range of the amplifier, increase the linearity of the frequency response, and to increase the linearity of the gain-response characteristic. The preferred method comprises coupling emitters of the differential-pair transistors with a degeneration resistance including a degeneration FET; coupling collectors of the differential-pair transistors with a load resistance including a load FET; and increasing a gain factor of the differential-pair transistors by simultaneously decreasing the degeneration resistance and increasing the load resistance. Preferably the load FET is a P-type FET and the degeneration FET is an N-type FET. In some preferred embodiments, the degeneration FET and load FET are controlled using gate voltages that are generated using a control circuit which incorporates the threshold voltage and other process-dependent variables.

In another preferred method of controlling the gain of a differential pair transistor amplifier, the method comprises (a) coupling emitters of the differential-pair transistors with a degeneration FET and (b) adjusting a gain factor of the differential-pair transistors by changing a resistance of the degeneration FET by first generating a current signal in response to a gain control signal, then passing the current signal through a matching FET, and then applying a gate-voltage signal obtained from the matching FET to a gate node of the degeneration FET. The matching FET has a threshold voltage $V_{TH}$ substantially equal to the threshold voltage of the degeneration FET. In addition, the drain node of the matching FET is voltage matched to a node of the degeneration FET. Thus, the gate-voltage signal that is induced on the gate node of the matching FET in response to the current signal passing through the matching FET will exhibit a non-linear characteristic that incorporates the FET threshold voltage $V_{th}$, making the control signal significantly process independent.

In some of the preferred embodiments, the gain is increased in response to a desired gain control signal, such as a voltage generated by an envelope detector, peak detector, or similar AGC feedback circuit. The desired gain control signal may be converted into a first gate-voltage control signal for controlling the degeneration resistance and a second gate-voltage control signal for controlling the load resistance. In preferred embodiments, if the desired gain control signal is a voltage signal, it is first converted to a first and second current signals. The current signal is directly proportional to the desired gain control signal. The first and second current signals are converted to the first gate-control voltage and the second gate-control voltage, respectively, by passing the first and second current signals through a first and second matching FET to establish the first gate-control voltage and the second gate-control voltage on gate nodes of the first and second matching FETs, respectively.

The matching FETs have threshold voltages $V_{TH}$ substantially equal to the threshold voltages of the degeneration FET and the load FET. In addition, the drain node of each of the matching FETs are voltage matched to the respective degeneration and load FETs. In this way, as described above, the current passing through the matching FETs will induce a non-linear gate voltage on the matching FETs which can be used to control the load and degeneration FETs in a process-independent manner. Finally, the load FET provides an amplifier transfer function pole at a location approximately equal to an amplifier transfer function zero associated with the degeneration FET.

BRIEF DESCRIPTION OF THE DRAWINGS

The objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 1:
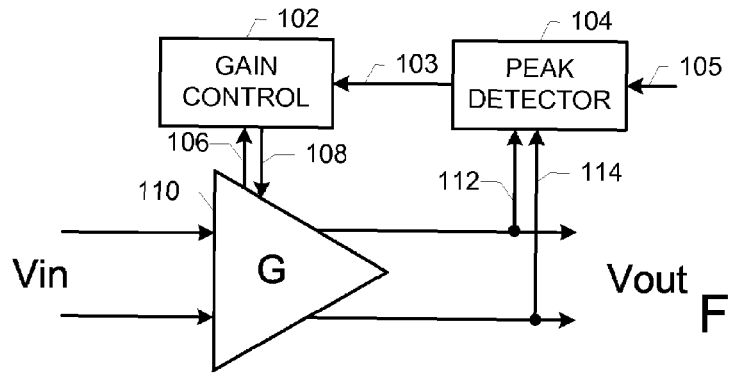
FIG. 1 depicts one embodiment of the amplifier and control circuit in an AGC application.

With reference to FIG. 1, the differential amplifier 110 accepts input signal Vin and generates output signal Vout. The output signal is monitored via lines 112, 114 by peak detector circuit 104. In this embodiment, peak detector 104 generates a control signal 103 based on the output signal and a reference level 105, and provides the control signal 103 to gain control circuit 102. The gain control circuit 102 receives node voltage (s) as shown by arrow 106, and provides gain control signals 108 to the amplifier 110. In preferred embodiments the control signal 103 is a voltage signal representing a desired gain of amplifier 110. Alternatively, the desired gain signal may take the form of a current signal.

In operation, as the output envelope of amplifier 110 changes in response to alterations in the envelope of the input signal Vin, the peak detector 104 determines whether the gain of amplifier 110 needs to be adjusted. Rather than directly applying the gain control signal to the amplifier, such as by directly controlling a degeneration resistance or a load resistance associated with the amplifier 110, the gain control circuit 102 alters the desired gain signal 103 so that any changes in the desired gain signal 103 result in a control signal which is process independent, thereby providing a more consistent and predictable change in the actual gain of amplifier 110.

Figure 2:
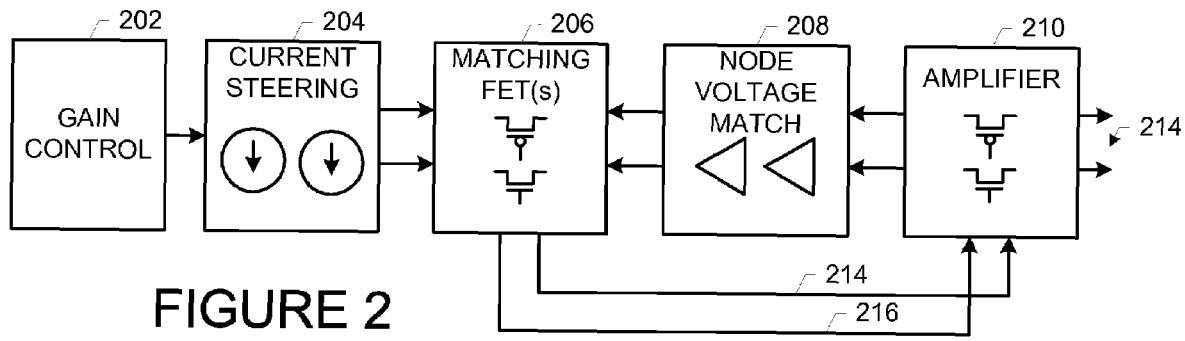
FIG. 2 depicts a block diagram of the control circuit and amplifier.

With respect to FIG. 2, a block diagram of the gain control circuit 102 will be described. Gain control blocked 202 generates a desired gain control signal and provides it to current steering block 204. Current steering block 204 generates a differential current signal that varies in direct proportion to the desired gain control signal. The differential current signal is applied to matching FET circuit 206. Node voltage matching circuit 208 receives node voltages from amplifier 210 and applies them to matching FET circuit 206. Matching FET circuit 206 responsively generates gate-voltage control signals 214, 216 for controlling the degeneration FET and load resistance FET associated with amplifier 210.

In alternative embodiments, current steering circuit 204 may be unnecessary when the gain control block 202 provides a current signal representing the desired gain. The current steering circuit 204 may also generate a single current signal in the event that amplifier 210 is implemented with only one gain control technique such as a variable degeneration resistance or a variable load resistance. In this case, matching FET circuit 206 would only require one node voltage and would responsively generate a single gate-voltage control signal.

Figure 3:
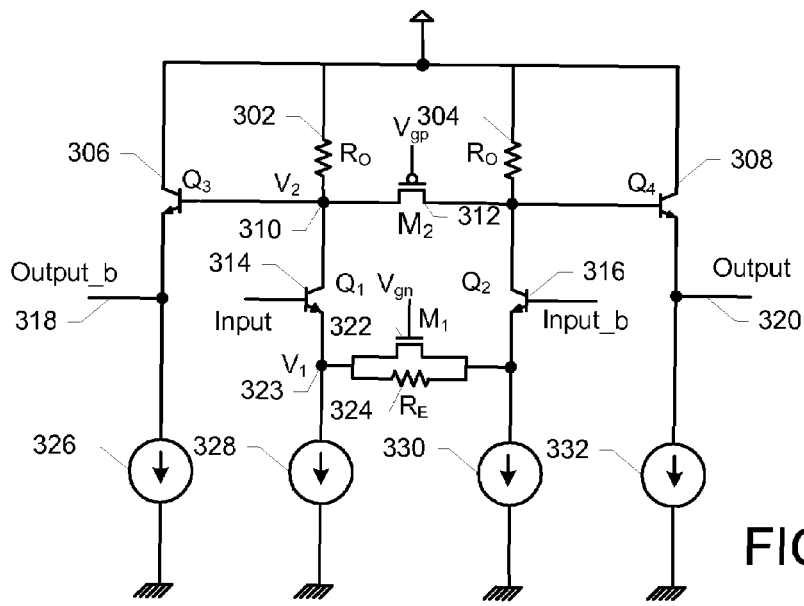
FIG. 3 depicts a circuit diagram of the amplifier.

One preferred embodiment of amplifier 210 is shown in FIG. 3. The amplifier includes current sources 326, 328, 330, 332, a first transistor pair 314, 316, a second transistor pair 306, 308, resistors 302, 304, 324, and gain control transistors 312, 322. Transistors 314, 316 form a differential pair of transistors, or more simply, a differential amplifier. Transistors 314, 316 accept a differential input signal at the base nodes of the transistor pair. A degeneration resistance is coupled between emitters of the pair of transistors. In the embodiment of FIG. 3, the degeneration resistance is a first FET $M_1$ 322 (N-type FET, or NMOS) in parallel with resistor $R_E$ 324. The differential amplifier has a gain that is approximately inversely proportional to the degeneration resistance. Thus, the gain is maximized when FET 310 is biased to conduct, and is reduced as the FET 310 is turned off. Transistors 306, 308 act as a buffer stage for the differential pair amplifier, and serve to adjust the common mode voltage for further stages of the amplifier.

In this embodiment, a load resistance made up of resistors 302, 304, is provided. In addition, a load resistance is also coupled between the collectors of the pair of transistors 314, 316, the load resistance being a second FET $M_2$ 312 (P-type FET, or PMOS). As the FET 312 is turned on, the gain G of the amplifier is decreased. The second gain control is optionally included to enhance the gain control linearity, as well as to extend the range of the gain factor G and to reduce peaking, as described herein.

The overall gain factor of the differential amplifier is adjusted by decreasing the degeneration resistance (increasing the conductivity of FET 322) and increasing the load resistance (decreasing the conductivity of FET 312). Because the FETs 322, 312 exhibit process-dependent characteristics in response to a linear change in their gate voltage, the gain of the amplifier will exhibit process-dependent characteristics as well. Therefore, the gain control circuit is designed to receive a desired gain control signal and responsively generate a first gate-voltage control signal for controlling the degeneration FET 322 and to generate a second gate-voltage control signal for controlling the load resistance FET 312. The gate-voltage control signals are generated in a manner that accounts for process variations such as a threshold voltage $V_{th}$, a charge-carrier effective mobility $\mu_n$, a gate oxide capacitance per unit area $C_{ox}$ and a gate width (W) and length (L).

The amplifier circuit of FIG. 3 may be characterized as having a gain as follows:

$$G = \frac{R_O // \frac{R_{FET,M2}}{2}}{1 + g_m\left(\frac{R_E}{2} // \frac{R_{FET,M1}}{2}\right)},$$

which may be simplified by making certain assumptions to be:

$$G = \frac{2R_O}{R_E} \frac{(1 + 2K_1 R_E(V_{GS1} - V_{th}))}{(1 + 4K_2 R_O(V_{GS2} - V_{th}))},$$

where $K=\mu_n C_{ox}(W/L)$. Because for a FET in saturation, $$V_{GS} = \sqrt{\frac{I}{K}} + V_{th},$$

the gain may be expressed as:

$$G = \frac{2R_O}{R_E} \frac{\left(1 + 2R_E\sqrt{K_1 I_1}\right)}{\left(1 + 4R_O\sqrt{K_2 I_2}\right)}.$$

The gain is seen to be a function of the square root of the currents through the FETs, and the square root terms appear in both the numerator and denominator of the gain expression, resulting in significant cancellation of nonlinear characteristics. Thus, by controlling the resistance of both FETs 312, 322, the gain may be varied in a more linear manner with respect to the current. Also note that the total current is maintained as a constant such that $I_1 + I_2 = $ Constant.

Further, the control of the FETs is made process-independent. The inventors have recognized that the above equation for $V_{GS}$ indicates that a current applied to a FET may induce a gate voltage that varies in accordance with many process-dependent variables. The gate voltage may then be used to control another FET, resulting in control of the other FET in a process-independent manner. Thus, a current signal representing a desired gain may be applied to a pair of FETs to induce a pair of gate voltages that may in turn be used to control the FETs 312 and 322. That is, as the control current is increased, the actual gain of the amplifier increases in a substantially direct linear proportion because the FET currents change in a process-independent manner, and both the numerator and denominator include terms involving the square root of the currents, substantially offsetting nonlinear characteristics of the amplifier gain control. Note that in the event the gain control signal is provided as a voltage signal, it may be converted first to a current signal.

Figure 4:
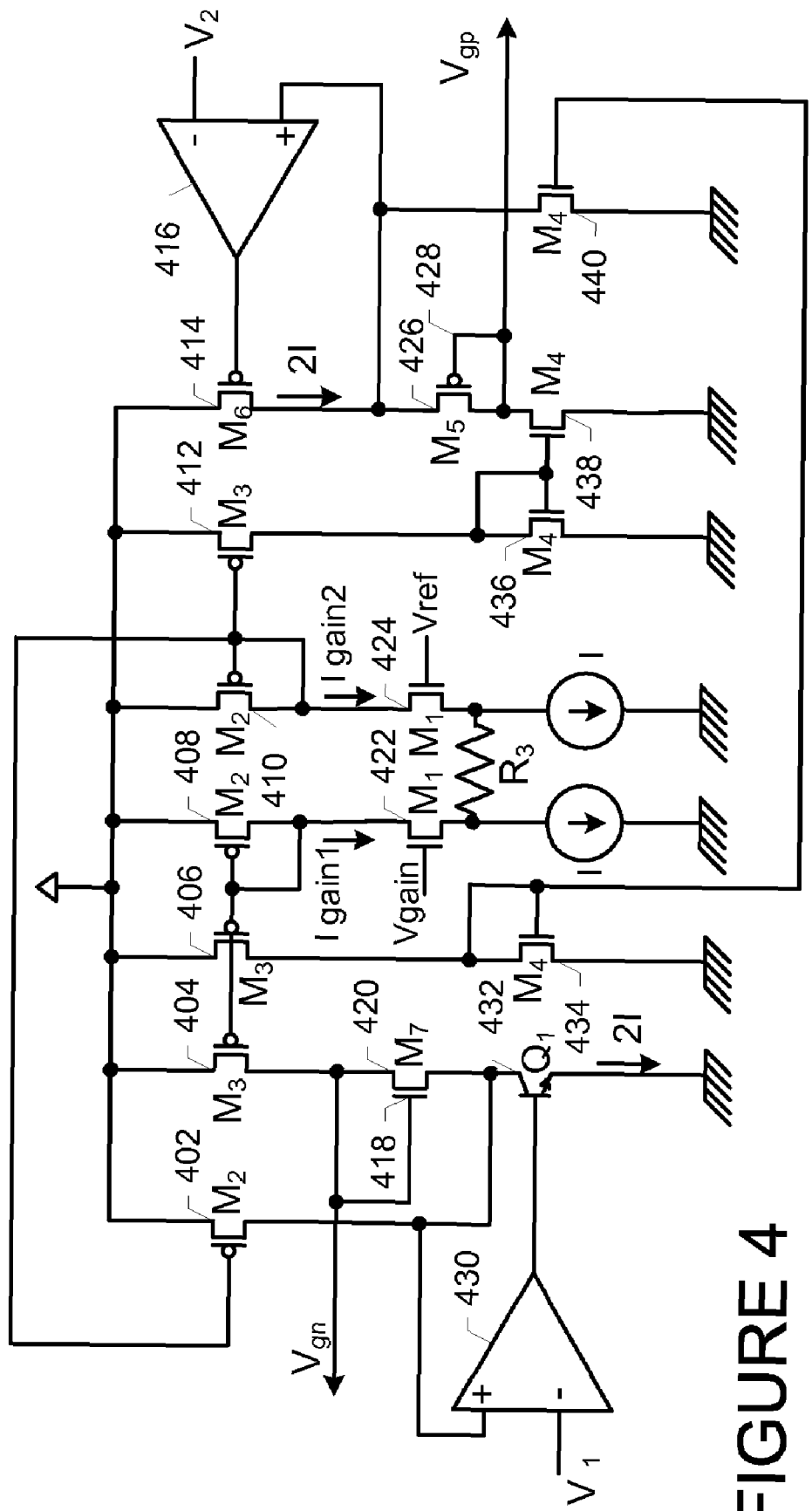
FIG. 4 depicts one embodiment of the control circuit.

Referring to FIG. 4, a preferred embodiment of the control circuit will be described. A desired gain signal V$_{gain}$ is applied to the current steering circuit made up FETs 422, 424 to generate a first current signal I$_{gain1}$ and a second current signal I$_{gain2}$. The first and second current signals may also be characterized as a differential current signal. The first current signal is passed through FET 408, and is mirrored to FETs 406, 404. The second current signal is passed through FET 410, and is mirrored to FETs 412, 402. The first current signal, now flowing through FET 404 is applied to matching FET 420. Operational amplifier 430 receives as one input the voltage at node V1 323 from one side of FET 322 of FIG. 3. The other input is the drain node of FET 420, and through the bias in the transistor Q1 432, the drain of FET 420 is maintained at voltage V1. The gate voltage Vgn of matching FET 420 appearing at the gate node 418 is then used to control the gate of degeneration FET 322.

Similarly, the second current signal, now flowing through FETs 412, 436, is mirrored to FET 438 and is applied to matching FET 426. Operational amplifier 416 receives as one input the voltage at node V2 310 from one side of FET 312 of FIG. 3. The other input is the source node of FET 426, and through the action of FET transistor 414, the source of matching FET 426 is maintained at voltage V2. The gate voltage Vgp of matching FET 426 appearing at the gate node 428 is then used to control the gate of load FET 312. Thus, as described above, the gain control circuit converts the first and second current signal to the first gate-control voltage and the second gate-control voltage, respectively. In particular, the control circuit converts the first and second current signals to the first gate-control voltage and the second gate-control voltage by passing the first and second current signals through a first and second matching FETs 420, 426, respectively.

Note that the control circuit in the embodiment of FIG. 4 accepts a gain control signal in the form of a voltage signal, and converts the gain control voltage to a pair of gain control current signals I$_{gain1}$ and I$_{gain2}$. The control circuit also includes a matching FET circuit for converting the pair of gain control current signals into a first gate-voltage control signal for controlling the degeneration resistance and a second gate-voltage control signal for controlling the load resistance. Each of the gain control current signals vary in direct proportion to the gain control voltage, and the first gate-control voltage and the second gate-control voltage vary in response to the pair of gain control current signals and in response to V$_{TH}$ and other process variables associated with the matching FET circuit. The control circuit also preferably includes a node voltage matching circuit to apply the appropriate voltages to the matching FET circuit.

Note also that the second current signal mirrored to FET 402 is combined with the first current signal applied to matching FET 420 so that the total current through transistor Q1 432 remains constant. This helps to ensure that the settling time of operational amplifier 430 of the node voltage matching circuit remains constant under different gain settings. Similarly the first current signal mirrored to FET 440 is added to the second current signal applied to matching FET 426 so that the total current through FET 414 remains constant under different gain settings.

Figure 5A:
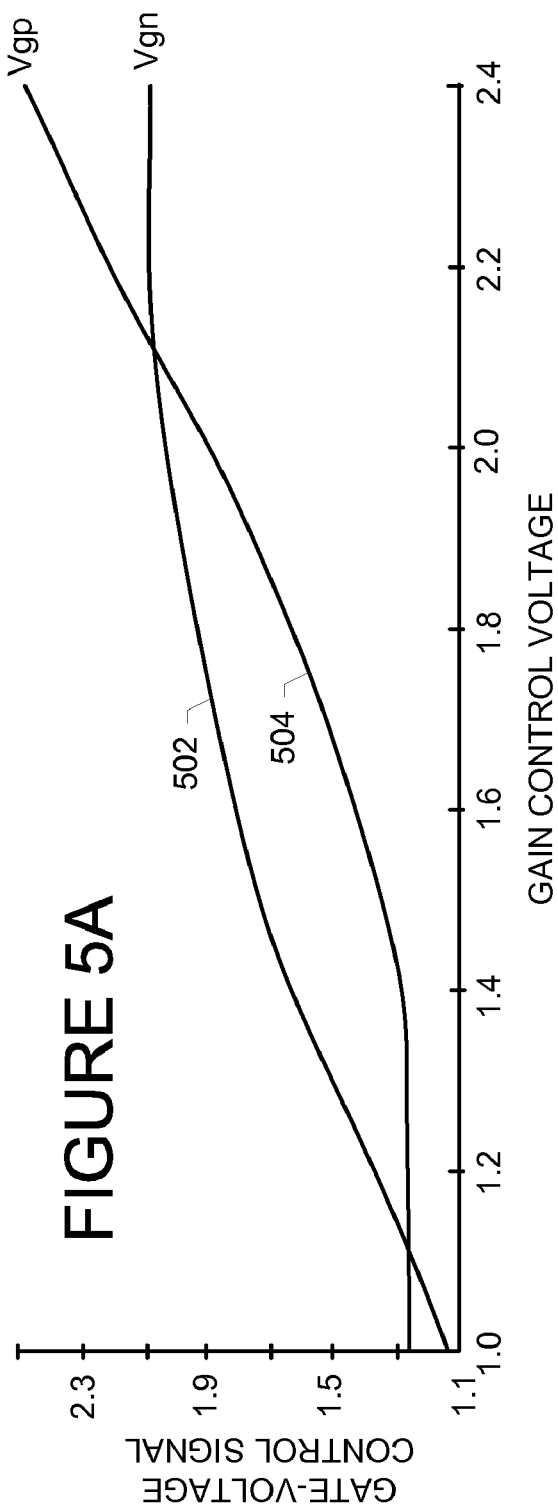
FIG. 5A depicts a graph of the control voltages.
Figure 5B:
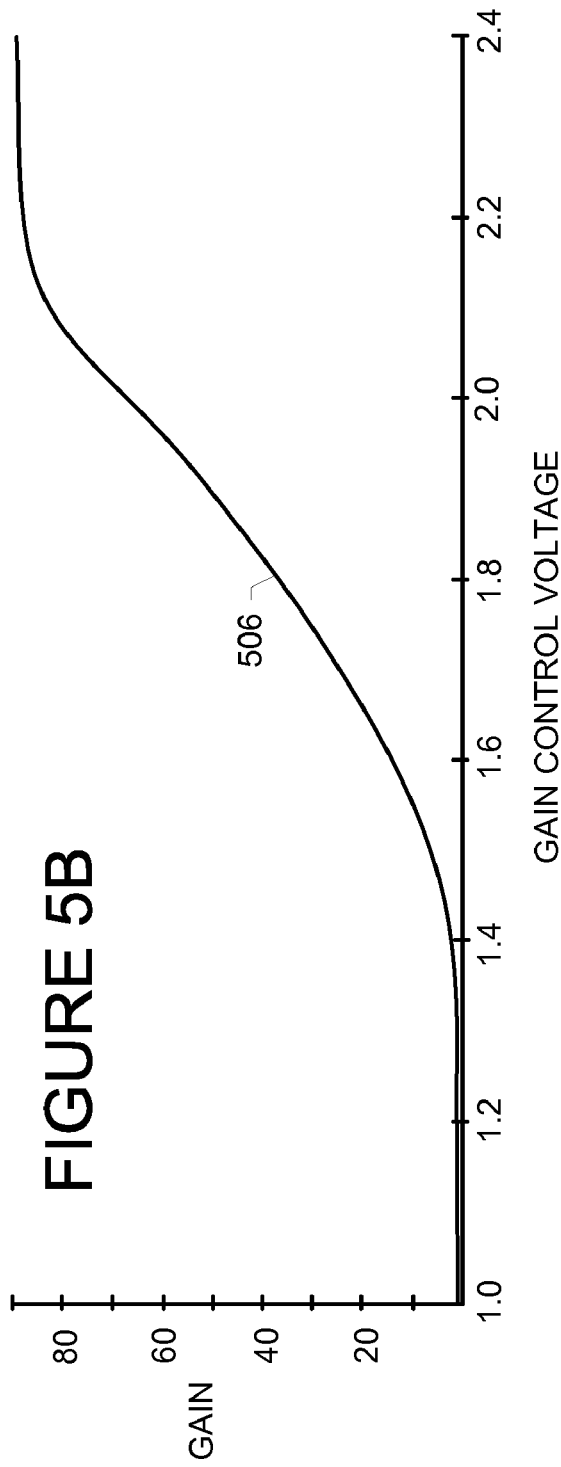
FIG. 5B depicts a graph of the amplifier gain as a function of the gain control voltage.

With reference to FIG. 5A, the gate-voltage control signals Vgn 502, Vgp 504 are shown as a function of the gain control voltage (or alternatively, as a function of the gain control current, which is generated in direct proportion to the gain control voltage). Note the nonlinear characteristics of the gate-voltage control signal curves 502, 504. Using the gate-voltage control signals, in turn, results in an amplifier gain versus gain control voltage curve 506 is shown in FIG. 5B. The gain control circuit thus provides a highly linear amplifier gain control when used in combination with the load FET and degeneration FET.

As described above, the addition of the load resistance FET contributes a square-root term in the denominator of the gain function that serves to offset the square-root term in the numerator, which originated with the degeneration FET. These offsetting factors increase the linearity of the amplifier gain with respect to the gain control signal. In addition, the load resistance FET improves the linearity of the overall frequency response of the amplifier by providing a pole to offset the zero introduced by the degeneration FET. This substantially reduces peaking at the high frequency range of the amplifier. This can be seen by considering the amplifier transfer function, T:

$$T = \frac{R_O}{R_E} \frac{(1 + sR_E C_E)}{(1 + R_O C_O)},$$

where R$_O$ and R$_E$ are the load resistance and degeneration resistance, respectively, and C$_O$ and C$_E$ are associated with the gate capacitance of the load FET and degeneration FET, respectively.

Figures 6A, 6B:
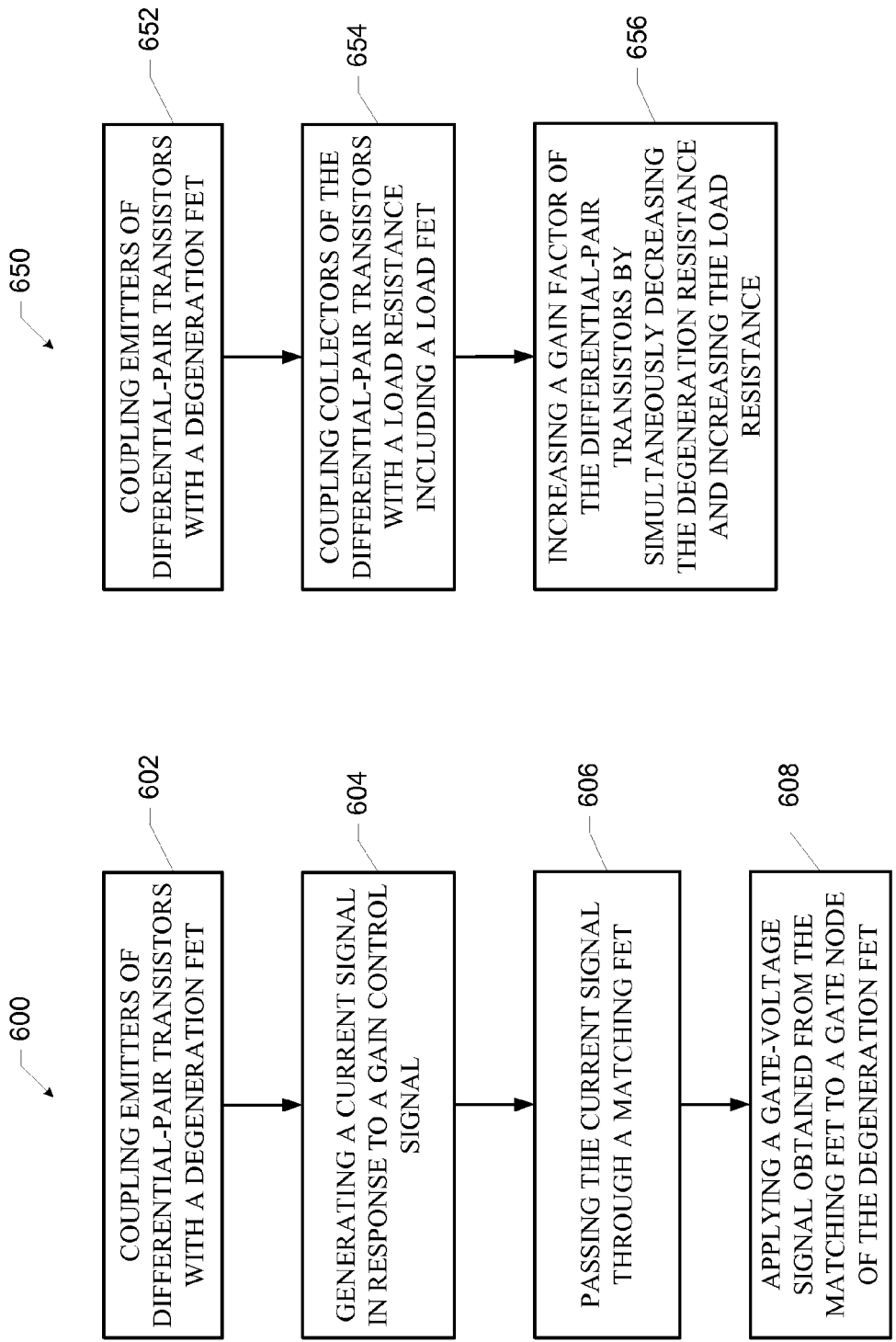
FIGS. 6A and 6B depicts flow diagrams of preferred methods of controlling an amplifier gain.

One preferred method 600 of controlling the gain of a differential pair transistor amplifier is shown in FIG. 6A. The method 600 comprises coupling emitters of the differential-pair transistors with a degeneration FET at step 602 and adjusting a gain factor of the differential-pair transistors by changing a resistance of the degeneration FET by first generating a current signal in response to a gain control signal at step 604, then passing the current signal through a matching FET at step 606, and then applying a gate-voltage signal obtained from the matching FET to a gate node of the degeneration FET at step 608. The matching FET preferably has a threshold voltage V$_{th}$ substantially equal to the threshold voltage of the degeneration FET. In addition, the drain node of the matching FET is voltage matched to a node of the degeneration FET. Thus, the gate-voltage signal that is induced on the gate node of the matching FET in response to the current signal passing through the matching FET will exhibit a non-linear characteristic, which when applied to the degeneration FET, will result in a process-independent characteristic of the degeneration FET.

In an alternative method, a load resistance may also be used to increase the tuning range of the amplifier, to increase the linearity of the frequency response, and to increase the linearity of the gain-response characteristic. The alternative preferred method 650, as shown in FIG. 6B, comprises coupling emitters of the differential-pair transistors with a degeneration resistance including a degeneration FET at step 652; coupling collectors of the differential-pair transistors with a load resistance including a load FET at step 654; and increasing a gain factor of the differential-pair transistors by simultaneously decreasing the degeneration resistance and increasing the load resistance at step 656. Preferably the load FET is a P-type FET and the degeneration FET is an N-type FET. In some of the preferred embodiments, the gain is increased in response to a desired gain control signal, such as a voltage generated by an envelope detector, peak detector, or similar AGC feedback circuit.

The claims should not be read as limited to the described order of elements unless stated to that effect. In addition, use of the term "means" in any claim is intended to invoke 35

U.S.C. §112, paragraph 6, and any claim without the word "means" is not so intended. Therefore, all embodiments that come within the scope and spirit of the following claims and equivalents thereto are claimed as the invention.

We claim:

1. An electronic amplifier circuit comprising:
    a differential amplifier having a pair of transistors accepting a differential input signal at base nodes of the transistor pair;
    a degeneration resistance coupled between emitters of the pair of transistors, the degeneration resistance comprising a first field effect transistor (FET);
    a load resistance coupled between collectors of the pair of transistors, the load resistance comprising a second FET; and,
    a control circuit for increasing the gain factor of the differential amplifier by decreasing the degeneration resistance and increasing the load resistance
    wherein the control circuit receives a desired gain control signal and responsively generates a first gate-voltage control signal for controlling the degeneration resistance and generates a second gate-voltage control signal for controlling the load resistance; and
    wherein the control circuit converts the desired gain control signal to a first and second current signal, and converts the first and second current signal to the first gate-control voltage and the second gate-control voltage, respectively.

2. The electronic amplifier circuit of claim 1 wherein the degeneration resistance comprises a fixed resistor in parallel with the first FET.

3. The electronic amplifier circuit of claim 1 wherein the first FET is an N-type FET and the load resistance is a P-type FET.

4. The electronic amplifier circuit of claim 1 wherein the control circuit converts the first and second current signals to the first gate-control voltage and the second gate-control voltage by passing the first and second current signals through first and second matching FET, respectively.

5. The electronic amplifier circuit of claim 1 wherein the control circuit includes a differential current steering circuit to convert a gain control voltage to a pair of gain control current signals, and a matching FET circuit for converting the pair of gain control current signals into a first gate-voltage control signal for controlling the degeneration resistance and a second gate-voltage control signal for controlling the load resistance.

6. The electronic amplifier circuit of claim 5 wherein the pair of gain control current signals vary in direct proportion to the gain control voltage, and wherein the first gate-control voltage and the second gate-control voltage vary in response to the pair of gain control current signals and in response to $V_{TH}$ associated with the matching FET circuit.

7. A method of controlling the gain of a differential pair transistor amplifier comprising:
    coupling emitters of the differential-pair transistors with a degeneration resistance including a degeneration FET;
    coupling collectors of the differential-pair transistors with a load resistance including a load FET; and
    increasing a gain factor of the differential-pair transistors by simultaneously decreasing the degeneration resistance and increasing the load resistance;
    wherein the gain is increased in response to a desired gain control signal by converting the desired gain control signal into a first gate-voltage control signal for controlling the degeneration resistance and a second gate-voltage control signal for controlling the load resistance; and
    wherein the desired gain control signal is first converted to a first and second current signal, and the first and second current signals are converted to the first gate-control voltage and the second gate-control voltage, respectively.

8. The method of claim 7, wherein the load FET is a P-type FET and the degeneration FET is an N-type FET.

9. The method of claim 7 wherein the first and second current signals are converted to the first gate-control voltage and the second gate-control voltage, respectively, by passing the first and second current signals through as first and second matching FET to establish the first gate-control voltage and the second gate-control voltage on gate nodes of the first and second matching FETs, respectively.

10. The method of claim 7 wherein the degeneration resistance includes a resistive element in parallel with the degeneration FET, and the degeneration resistance is decreased by increasing a gate voltage on the degeneration FET.

11. The method of claim 7 wherein simultaneously decreasing the degeneration resistance and increasing the load resistance comprises:
    generating a differential current signal in response to a gain control signal;
    passing the differential current signal through a pair of matching FETs; and,
    applying a first and second gate-voltage signal obtained from the pair of matching FETs t to the degeneration FET and the load FET, respectively.

12. The method of claim 11 wherein each of the matching FETs have threshold voltages $V_{TH}$ substantially equal to the threshold voltages of the degeneration FET and the load FET.

13. The method of claim 7 wherein the load FET provides an amplifier transfer function pole at a location approximately equal to an amplifier transfer function zero associated with the degeneration FET.

14. A method of controlling the gain of a differential pair transistor amplifier comprising:
    coupling emitters of the differential-pair transistors with a degeneration FET; and,
    adjusting a gain factor of the differential-pair transistors by changing a resistance of the degeneration FET by (i) generating a current signal in response to a gain control signal, (ii) passing the current signal through a matching FET, and (iii) applying a gate-voltage signal obtained from the matching FET to a gate node of the degeneration FET.

15. The method of claim 14 wherein the matching FET has a threshold voltage $V_{TH}$ substantially equal to the threshold voltage of the degeneration FET.

16. The method of claim 14 wherein a drain node of the matching FET is voltage matched to a node of the degeneration FET, and the gate-voltage signal is induced on the gate node of the matching FET in response to the current signal passing through the matching FET.

* * * * *

UNITED STATES PATENT AND TRADEMARK OFFICE
CERTIFICATE OF CORRECTION

PATENT NO. : 7,592,869 B2  
APPLICATION NO. : 11/856681  
DATED : September 22, 2009  
INVENTOR(S) : Bae et al.

It is certified that error appears in the above-identified patent and that said Letters Patent is hereby corrected as shown below:

Column 2  
Line 52, change "depicts" to --depict--

Column 3  
Line 15, change "blocked" to --block--

Signed and Sealed this

Twenty-third Day of February, 2010

David J. Kappos  
*Director of the United States Patent and Trademark Office*